United States Patent
Utsunomiya et al.

(10) Patent No.: US 8,433,262 B2
(45) Date of Patent: Apr. 30, 2013

(54) TRANSMISSION DEVICE AND TRANSMISSION METHOD

(75) Inventors: Yuichi Utsunomiya, Kawasaki (JP);
Nobukazu Fudaba, Kawasaki (JP);
Hiroyoshi Ishikawa, Kawasaki (JP);
Hajime Hamada, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 370 days.

(21) Appl. No.: 12/850,998

(22) Filed: Aug. 5, 2010

(65) Prior Publication Data

US 2011/0053531 A1    Mar. 3, 2011

(30) Foreign Application Priority Data

Sep. 1, 2009    (JP) .................... 2009-201247

(51) Int. Cl.
*H01Q 11/12*    (2006.01)
*H04B 1/04*    (2006.01)

(52) U.S. Cl.
USPC ............... 455/126; 455/114.2; 455/115.1; 455/127.1

(58) Field of Classification Search ......... 455/114.2, 455/115.1, 296–297, 126–127.5
See application file for complete search history.

(56) References Cited

U.S. PATENT DOCUMENTS

| | | | |
|---|---|---|---|
| 6,366,177 B1 * | 4/2002 | McCune et al. ............ 332/103 |
| 7,058,425 B1 * | 6/2006 | Takakusaki ................. 455/561 |
| 7,447,484 B2 | 11/2008 | Ishikawa et al. |
| 7,480,344 B2 * | 1/2009 | Zolfaghari et al. ........... 375/297 |
| 7,782,153 B2 * | 8/2010 | Nagatani et al. ............. 331/186 |
| 2005/0245208 A1 * | 11/2005 | Udagawa et al. ............. 455/102 |
| 2007/0159242 A1 * | 7/2007 | Nagatani et al. ............. 329/347 |
| 2007/0159256 A1 | 7/2007 | Ishikawa et al. |
| 2009/0093224 A1 * | 4/2009 | Shi et al. ..................... 455/126 |

FOREIGN PATENT DOCUMENTS

| | | |
|---|---|---|
| JP | 2007-180795 | 7/2007 |
| JP | 2008-22513 | 1/2008 |
| KR | 10-2007-0075290 | 7/2007 |

OTHER PUBLICATIONS

Korean Notice of Preliminary Rejection dated Jan. 6, 2012, from corresponding Korean Application No. 10-2010-84028.
Japanese Office Action dated Jan. 29, 2013, from corresponding Japanese Application No. 2009-201247.

* cited by examiner

*Primary Examiner* — Nguyen Vo
*Assistant Examiner* — Rui Hu
(74) *Attorney, Agent, or Firm* — Katten Muchin Rosenman LLP

(57) ABSTRACT

A disclosed transmission device includes a voltage control signal generating unit configured to generate a first voltage control signal from a transmission signal, an amplifier configured to amplify the transmission signal in response to the first voltage control signal, a first timing adjusting unit configured to adjust a control timing for the first voltage control signal, and a control timing setting unit configured to set the control timing adjusted by the first timing adjusting unit based on the output signal from the amplifier and the transmission signal.

13 Claims, 14 Drawing Sheets

TRANSMISSION DEVICE AND TRANSMISSION METHOD

CROSS-REFERENCE TO RELATED APPLICATIONS

This patent application is based upon and claims the benefit of priority of the prior Japanese Patent Application No. 2009-201247 filed on Sep. 1, 2009, the entire contents of which are incorporated herein by reference.

FIELD

A certain aspect of the embodiments discussed herein is related to a mobile communication system, particularly to a delay adjusting method for voltage signals and transmission signals to be supplied to a voltage-controlled amplifier in a transmission device.

BACKGROUND

An improvement in power efficiency is beneficial to transmission devices of wireless communication systems because miniaturization and energy conservation are advancing in the transmission devices.

As an example of improving power efficiency of the power amplifier, there is a drain or gate voltage control technique for realizing highly efficient amplification by controlling a voltage applied to a drain or gate electrode as described in Japanese Laid-open Patent Publication No. 2008-22513. For this highly efficient amplification, timings of a signal input to the power amplifier and a voltage control signal may be matched for obtaining a predetermined output in the drain or gate voltage control technique.

SUMMARY

According to an aspect of the embodiment there is provided a transmission device including a voltage control signal generating unit configured to generate a first voltage control signal from a transmission signal, an amplifier configured to amplify the transmission signal in response to the first voltage control signal, a first timing adjusting unit configured to adjust a control timing for the first voltage control signal, and a control timing setting unit configured to set the control timing adjusted by the first timing adjusting unit based on the output signal from the amplifier and the transmission signal.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

EMBODIMENT

Preferred embodiments of the present invention will be explained with reference to accompanying drawings.

Through all figures, the same numerical references are used for portions having the same function and repetitive explanations of these portions are omitted.

<System>

Figure 1:
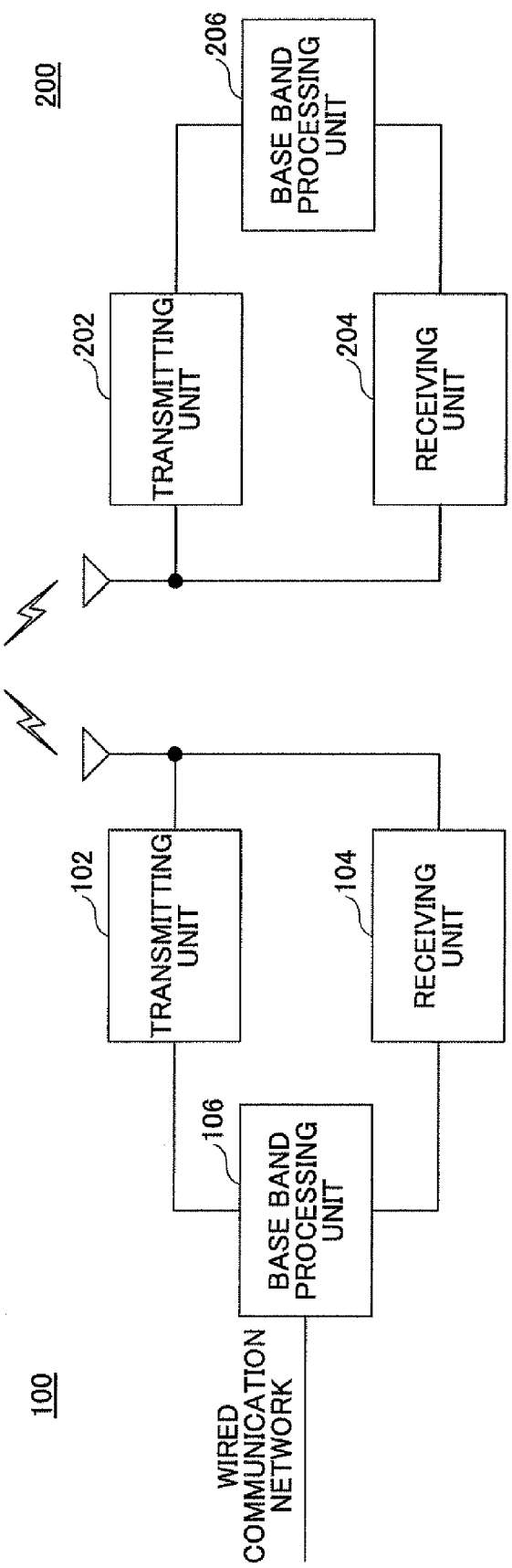
FIG. 1 is an example block diagram illustrating a function of a wireless communication system of an embodiment.

FIG. 1 is an example block diagram illustrating a function of a wireless communication system of the Embodiment.

The present system includes a base station (BS) 100 and a user equipment (UE) 200.

The base station (BS) 100 includes a transmitting unit 102, a receiving unit 104, and a base band processing unit 106.

The receiving unit 102 down-converts a radio signal received by an antenna into an intermediate frequency (IF), and outputs the down-converted radio signal to the base band processing unit 106. The base band processing unit 106 processes the signal input from the receiving unit 102 and sends the processed signal to a wired communication network.

On the other hand, the signal sent from the wired communication network is processed by the base band processing unit 106 and input to the transmitting unit 102. The transmitting unit 102 up-converts the signal input to the base band processing unit 106 into a radio frequency (RF) band, amplifies the up-converted signal, and sends the amplified signal.

The user equipment (UE) 200 includes a transmitting unit 202, a receiving unit 204, and a base band processing unit 206.

The receiving unit 202 transforms a high frequency signal received by the antenna and outputs the transformed signal to the base band unit 206. The base band processing unit 206 transforms the signal input by the receiving unit 202 to an analog signal. The analog signal transformed by the base band processing unit 206 is amplified and output from a speaker. On the other hand, an audio signal input by a microphone is input in the base band processing unit 206. The base band processing unit 206 transforms the input audio signal into a digital signal, and outputs the input audio signal to the transmitting unit 202. The transmitting unit 202 amplifies the digital signal input from the base band processing unit 206, and transmits the digital signal to the base station (BS) 100 with radio transmission.

A transmission device 300 illustrated in FIG. 2 to be described later is applicable to at least one of the base station (BS) 100 and the user equipment (UE) 200. For example, the transmission device 300 is applicable to at least one of a transmitting unit 102 of the base station 100 and a transmitting unit 202 of the user equipment (UE) 200.

The transmission device 300 of the Embodiment is applicable to an apparatus including an amplifier which amplifies the input signal and outputs the amplified signal. For example, the transmission device 300 is applicable to a personal digital assistance (PDA), a portable phone, or the like.

Hereinafter, the transmission device 300 is described in detail.

<Transmission Device>

Figure 2:
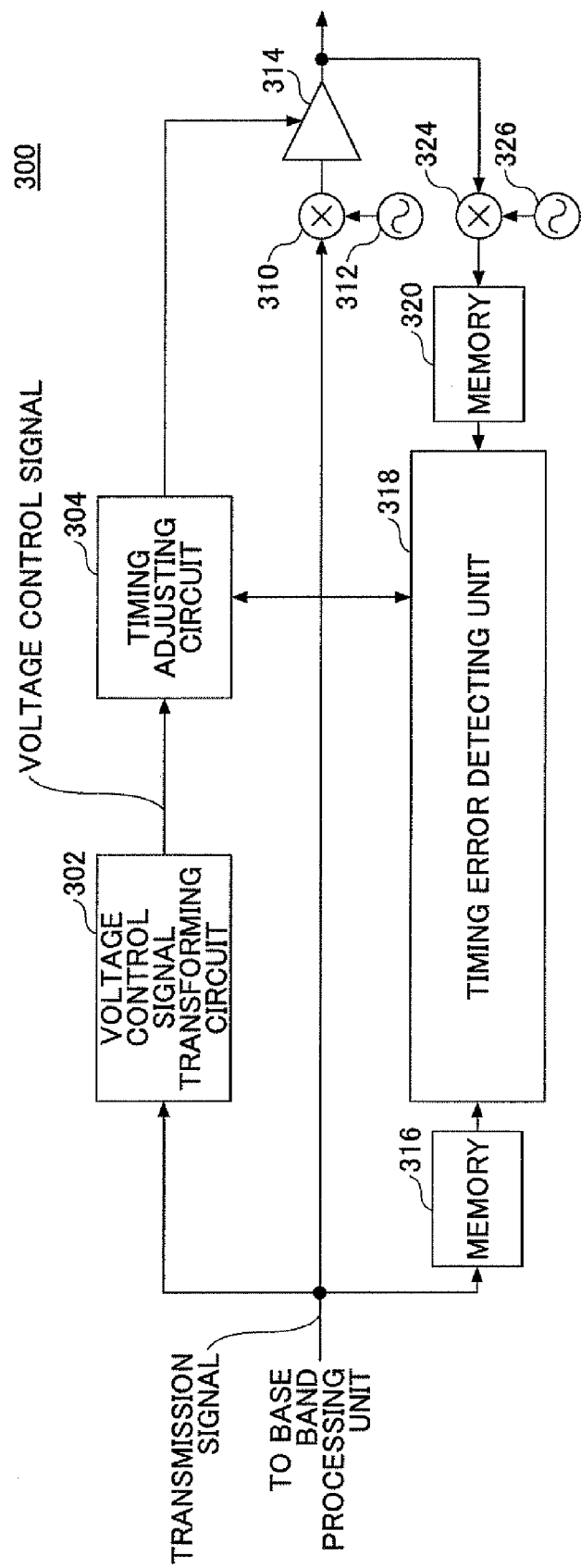
FIG. 2 is an example block diagram illustrating a part of a transmission device of the embodiment.

FIG. 2 is an example block diagram illustrating a part of the transmission device 300 of the Embodiment. The transmission device 300 includes a voltage control signal transforming circuit 302, a timing adjusting circuit 304, a modulator 310, an oscillator 312, an amplifier 314, a memory 316, a timing error detecting unit 318, a memory 320, a mixer 324, and an oscillator 326.

In the transmission device 300, a transmission signal is transformed into a voltage control signal. The voltage control signal may be used to set a gain for amplifying the transmission signal by the amplifier 314. For example, the gain may be set for a predetermined unit time based on the amplitude of the transmission signal in the predetermined unit time. The transmission device 300 controls the transmission signal and the voltage signal to match input timings of the transmission signal and the voltage control signal in the amplifier 314. For example, the transmission device 300 acquires a delay amount of the voltage control signal relative to the transmission signal in order to minimize a timing shift between the transmission signal and the signal amplified by the amplifier 314. By controlling the amplifier 314 to match the input timings of the transmission signal and the voltage control signal, an appropriate amplification is obtainable in response to the level of the transmission signal. Since a desirable amplification is obtainable in response to the strength and type of the transmission signal, amplification efficiency can be improved. Further since the amplification efficiency is improved, power efficiency can also be improved.

The process of acquiring the delay amount of the voltage control signal and the process of amplifying of the transmission signal are independently carried out. Accordingly, the delay amount is not changed while electric waves are transmitted. Therefore, the delay amount may be set without outputting spurious waves.

As described, the transmission device 300 includes a voltage control signal transforming circuit 302. The voltage control signal transforming circuit 302 is connected to a base band processing unit such as the band processing unit 106 or 206 illustrated in FIG. 1. The voltage control signal transforming circuit 302 transforms a digital signal input from the base band processing unit as the transmission signal, and outputs the voltage control signal to the timing adjusting circuit 304.

As described, the transmission device 300 includes the timing adjusting circuit 304. The timing adjusting circuit 304 is connected to the voltage control signal transforming circuit 302. The timing adjusting circuit 304 adjusts a timing of the voltage control signal input from the voltage control signal transforming circuit 302 in conformity with a delay set amount set by the timing error detecting circuit 318 described later. For example, the timing of the voltage control signal supplied to the amplifier 314 is adjusted.

As described, the transmission device 300 includes a modulator 310. The modulator 310 is connected to the base band processing unit. The modulator 310 modulates the input transmission signal using a signal from the oscillator 312 included in the transmission device 300, and outputs the modulated signal to the amplifier 314.

As described, the transmission device 300 includes the modulator 312. The oscillator 312 is connected to the modulator 310, and outputs an oscillation signal to the modulator 310.

As described, the transmission device 300 includes the amplifier 314. The amplifier 314 is connected to the modulator 310. The amplifier 314 amplifies the input signal from the modulator 310 and outputs the amplified signal. The output signal is output to the mixer 324 described later. Hereinafter, the output signal from the amplifier 314 is referred to as "feedback signal".

As described, the transmission device 300 includes the mixer 324. The mixer 324 is connected to an output terminal of the amplifier 314. The mixer 324 down-converts the feedback signal into an IF frequency based on an oscillating frequency of the oscillator signal from the oscillator 326, and outputs the feedback signal to the memory 320.

As described, the transmission device 300 includes the oscillator 326. The oscillator 326 is connected to the mixer 324, and outputs an oscillation signal to the mixer 324.

As described, the transmission device 300 includes the memory 320. The memory 320 is connected to the mixer 324, and stores a digital signal output from the mixer 324.

As described, the transmission device 300 includes the memory 316. The memory 316 is connected to the base band processing unit, and stores the transmission signal.

As described, the transmission device 300 includes the timing adjusting circuit 318. The timing error detecting unit 318 is connected to the timing adjusting circuit 314, the memory 316, and the memory 320. The timing error detecting unit 318 acquires the delay set amount of the voltage control signal relative to the transmission signal to minimize a timing shift between the transmission signal and the voltage control signal in the amplifier 314 based on the transmission signal stored in the memory 316 and the digital signal stored in the memory 320. The digital signal is a feedback signal downconverted and transformed by the mixer 324. For example, the timing error detecting unit 318 reads the transmission signal and the digital signal as time series data from the memory 316 and the memory 320, respectively. The timing error detecting unit 318 sets the acquired delay set amount in the timing adjusting circuit 304.

The processes in the voltage control signal transforming circuit 302, the timing adjusting circuit 304, and the timing error detecting unit 318 may be carried out by transmitting and receiving digital signals.

<Timing Error Detecting Unit—First Mode>

Figure 3:
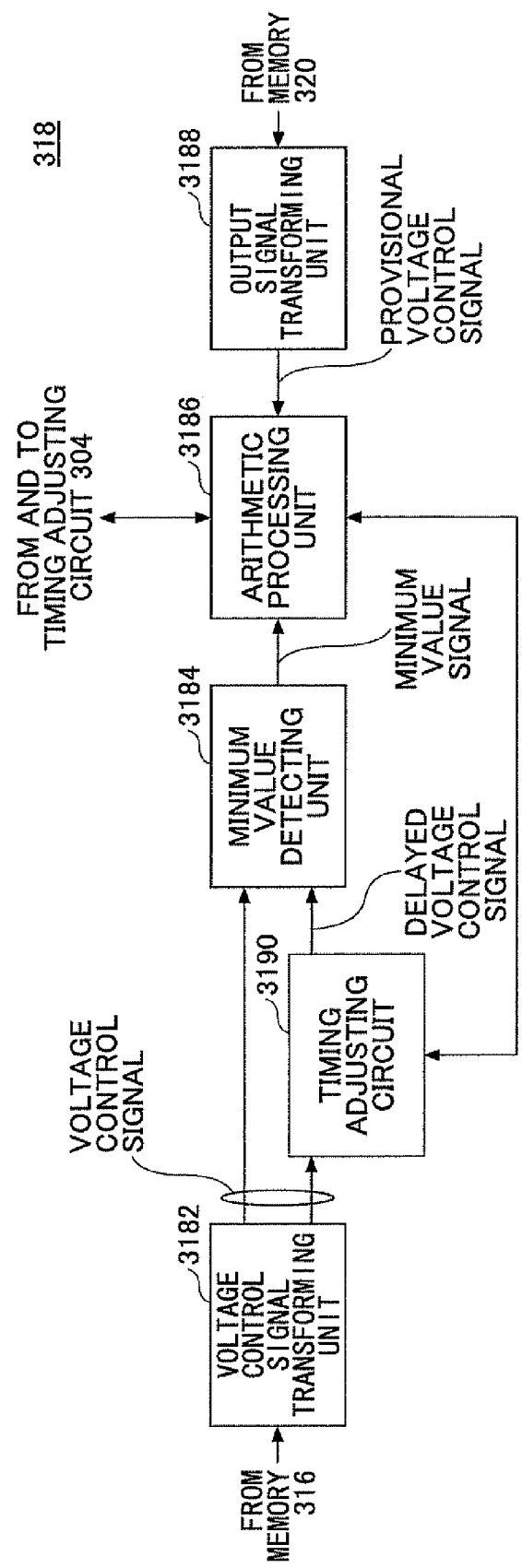
FIG. 3 is an example block diagram illustrating a part of the transmission device of the embodiment.

FIG. 3 is an example block diagram illustrating a first mode of the timing error detecting unit 318 as a part of the transmission device 300 of the embodiment.

The timing error detecting unit 318 includes a voltage control signal transforming unit 3182, a minimum value detecting unit 3184, an arithmetic processing unit 3186, an output signal transforming unit 3188, and a timing adjusting circuit 3190.

The voltage control signal transforming unit 3182 is connected to the memory 316, the minimum value detecting unit 3184, and the timing adjusting circuit 3190. The voltage control signal transforming unit 3182 reads the transmission signal stored in the memory 316 as time series data, transforms the read time series data into the voltage control signal, and outputs the transformed voltage control signal to the minimum value detecting unit 3184 and the timing adjusting circuit 3190.

As described, the timing adjusting circuit 3190 is connected to the voltage control signal transforming unit 3182. The timing adjusting circuit 3190 adjusts the timing of the voltage control signal input from the voltage control signal transforming unit 3182, and outputs the adjusted voltage control signal to the minimum value detecting unit 3184. For example, the voltage control signal is delayed by the timing adjusting circuit 3190 based on a delay set amount D2 which is set by an arithmetic processing unit 3186, and the timing adjusting circuit 3190 outputs the delayed voltage control signal to the minimum value detecting unit 3184. Hereinafter, the voltage control signal delayed by the timing adjusting circuit 3190 is referred to as "delayed voltage control signal".

As described, the minimum value detecting unit 3184 is connected to the control signal transforming circuit 3182, the timing adjusting circuit 3190, and the arithmetic processing unit 3186. The minimum value detecting unit 3184 acquires the minimum value between the voltage control signal input from the voltage control signal transforming unit 3182 and the delayed voltage control signal input from the timing adjusting circuit 3190, and outputs the minimum value to the arithmetic processing unit 3186 as a signal equivalent to a signal output from the output signal transforming unit 3188 described later. Hereinafter, the signal indicative of the minimum value is referred to as "minimum value signal".

Figure 4:
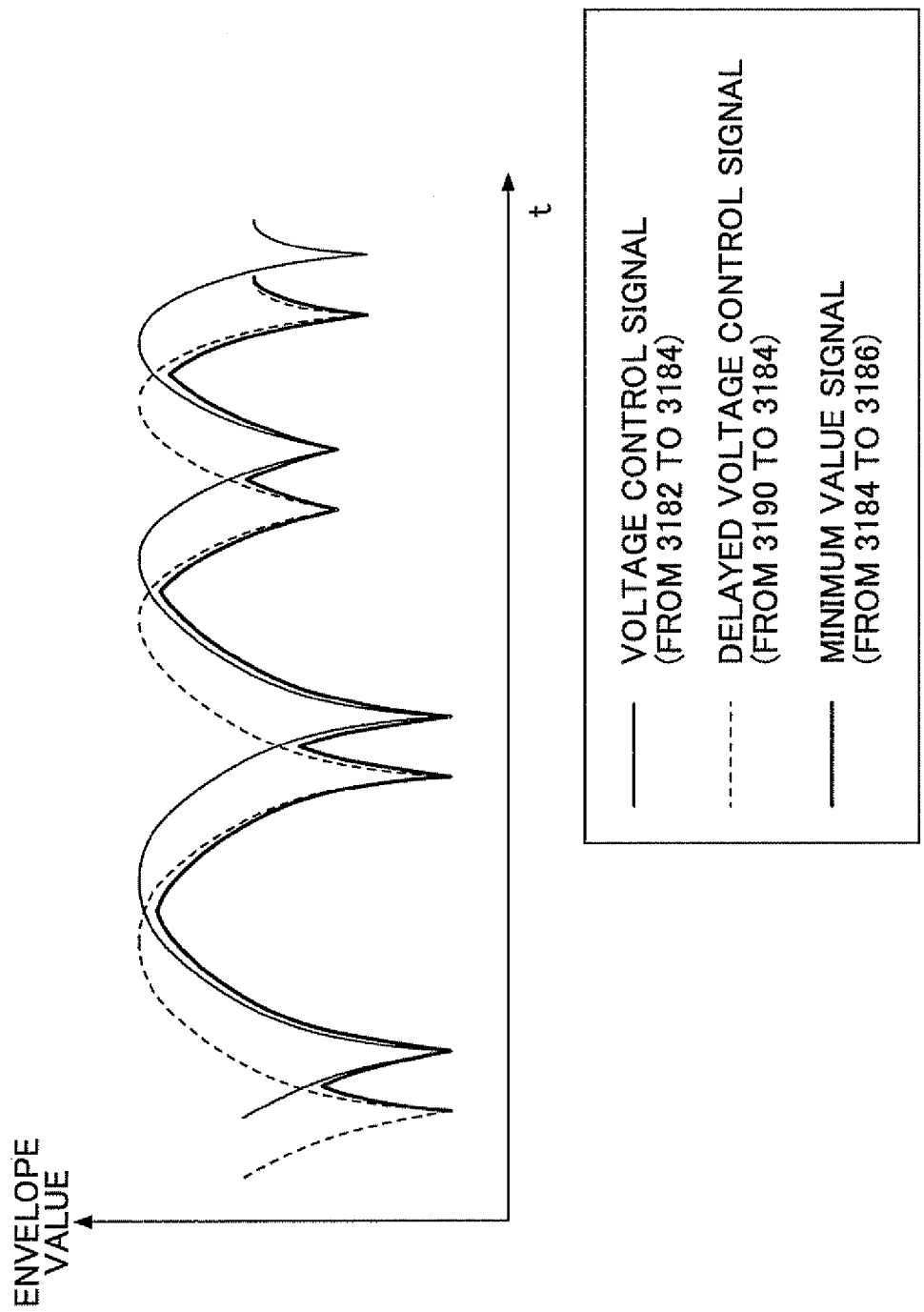
FIG. 4 is a graph schematically illustrating an operation of the transmission device of the embodiment.

FIG. 4 is a graph schematically illustrating an operation of the transmission device 300 in the minimum value detecting unit 3184 of the Embodiment.

Referring to FIG. 4, the abscissa represents time (t) and the ordinate represents envelope value. Solid lines designate the voltage control signal input from the voltage control signal transforming unit 3182. Broken lines designate the delayed voltage control signal which has been delayed based on the delay set amount D2 of the voltage control signal which is input by the timing adjusting circuit 3190. Heavy solid lines designate an output signal (minimum value signal) from the minimum value detecting unit 3184. The minimum value signal follows the smaller values between the values of the voltage control signal and the values of the delayed voltage control signal.

The output signal transforming unit 3188 is connected to the memory 320. The output signal transforming unit 3188 reads the feedback signal processed as described above and stored in the memory 320 as time series data, provisionally transforms the time series data into a provisional voltage control signal (hereinafter, the voltage control signal provisionally transformed by the output signal transforming unit 3188 is referred to as "provisional voltage control signal"), and outputs the provisional voltage control signal to the arithmetic processing unit 3186. In this, the "provisional voltage control signal" is processed by the voltage control signal transforming circuit 302, the voltage control signal transforming unit 3182, and mixer 324 to be down-converted in a similar manner to the above, but is not actually used as the voltage control signal.

Figure 5:
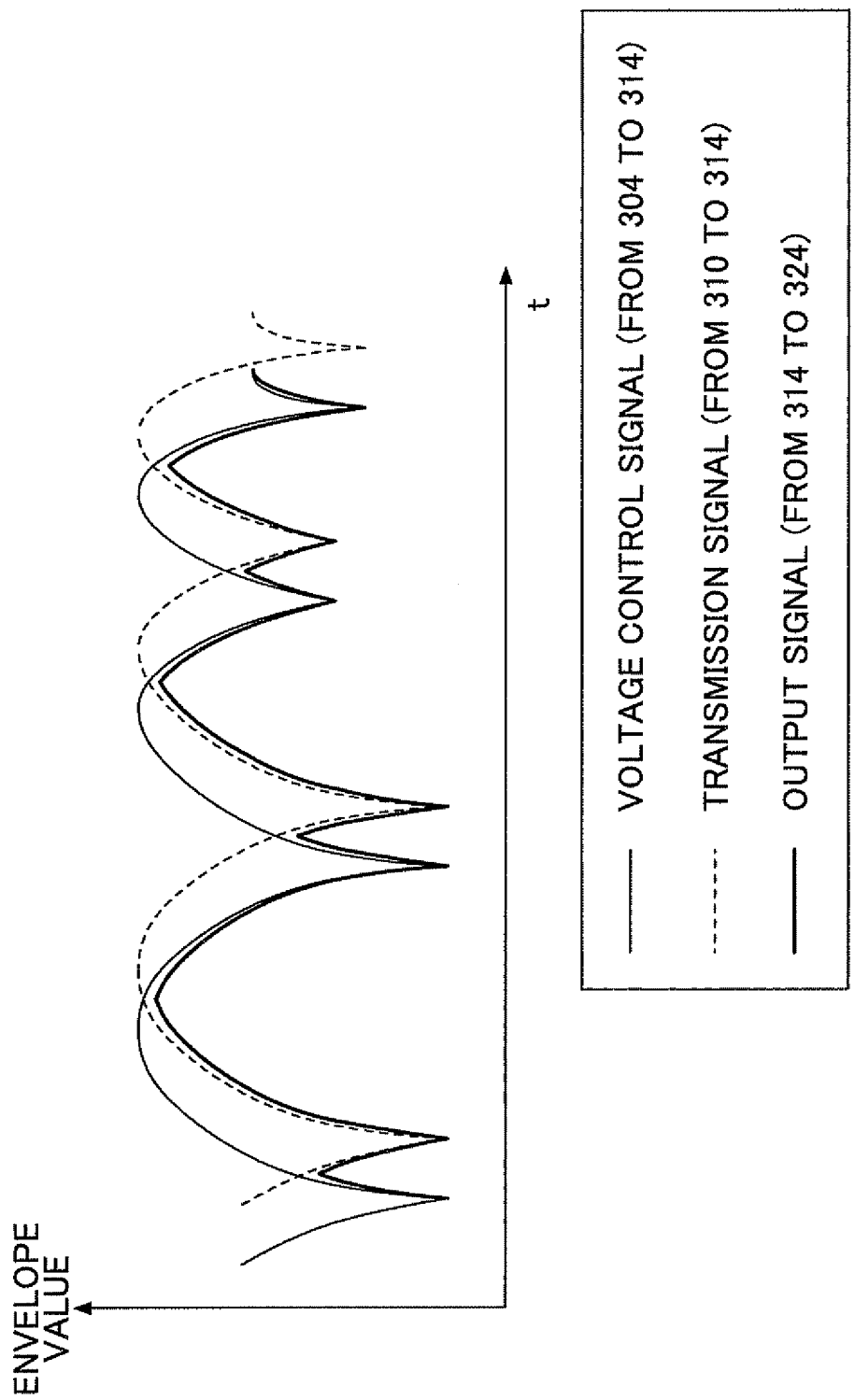
FIG. 5 is a graph schematically illustrating the operation of the transmission device of the embodiment.

FIG. 5 is a graph schematically illustrating an output signal from the amplifier 314 as the operation of the transmission device 300 of the Embodiment.

Referring to FIG. 5, the abscissa represents time (t) and the ordinate represents envelope value. Narrow solid lines designate the voltage control signal input from the timing adjusting circuit 304. Broken lines designate the transmission signal input from the modulator 310, i.e. the input signal to the amplifier 314. Heavy solid lines designate an output signal from the amplifier 314. Referring to FIG. 5, the output signal has plural drop points. When the timings of the transmission signal and the voltage control signal match, an interval of the drops of the transmission signal and an interval of the drops of the output signals become equal. However, when the timings do not match, the interval of the drops of the transmission signal and the interval of the drops of the output signals become different. Therefore, the number of drops of the output signal increases.

The arithmetic processing unit 3186 is connected to the timing adjusting circuit 304, the timing adjusting circuit 3190, the minimum value detecting unit 3184, and the output signal transforming unit 3188. The arithmetic processing unit 3186 compares the provisional voltage control signal input from the output signal transforming unit 3188 with the minimum value signal from the minimum value detecting unit 3184. The arithmetic processing unit 3186 acquires a timing error between the provisional voltage control signal and the minimum value signal. For example, the arithmetic processing unit 3186 acquires a time error between the provisional voltage control signal and the minimum value signal. The time error may be a delay amount. For example, the arithmetic processing unit 3186 may acquire a relationship between the provisional voltage control signal and the minimum value signal. The arithmetic processing unit 3186 temporarily stores the timing error, and changes the delay set amount D2 to be set in the timing adjusting circuit 3190. The arithmetic processing unit 3186 compares the provisional voltage control signal input from the output signal transforming unit 3188 with the minimum value signal from the minimum value detecting unit 3184 using the changed delay set amount D2. The arithmetic processing unit 3186 acquires a timing error between the provisional voltage control signal and the minimum value signal.

For example, the arithmetic processing unit 3186 acquires a time error between the provisional voltage control signal and the minimum value signal. The time error may be a delay amount. For example, the arithmetic processing unit 3186 may acquire a relationship between the provisional voltage control signal and the minimum value signal. The arithmetic processing unit 3186 temporarily stores the timing error. The change of the delay set amount D2 may be carried out until the timing error is minimized, or the number of times changing the delay set amounts D2 may be preset. When a correlation is obtained, obtaining the correlation may be carried out until the correlation is maximized, or the number of times changing the delay set amount D2 may be preset. For example, the timing error at a time of changing from decrementing to incrementing may be set as the minimum value up to which the delay set amount D2 is to be changed. On the other hand, the correlation at a time of changing from incrementing to decrementing may be set as the maximum value up to which the delay set amount D2 is to be changed. The arithmetic processing unit 3186 acquires a delay set amount D20 of a time when the timing error is minimized from the timing adjusting circuit 3190. The arithmetic processing unit 3186 may acquire the delay set amount D20 of a time when the correlation between the minimum value signal and the provisional voltage control signal is maximized from the timing adjusting circuit 3190. The arithmetic processing unit 3186 acquires the delay set amount D1 for the timing adjusting circuit 304 based on the acquired delay set amount D20. The arithmetic processing unit 3186 sets the delay set amount D1 in the timing adjusting circuit 304.

<Operation of the Transmission Device 300>

Figure 6:
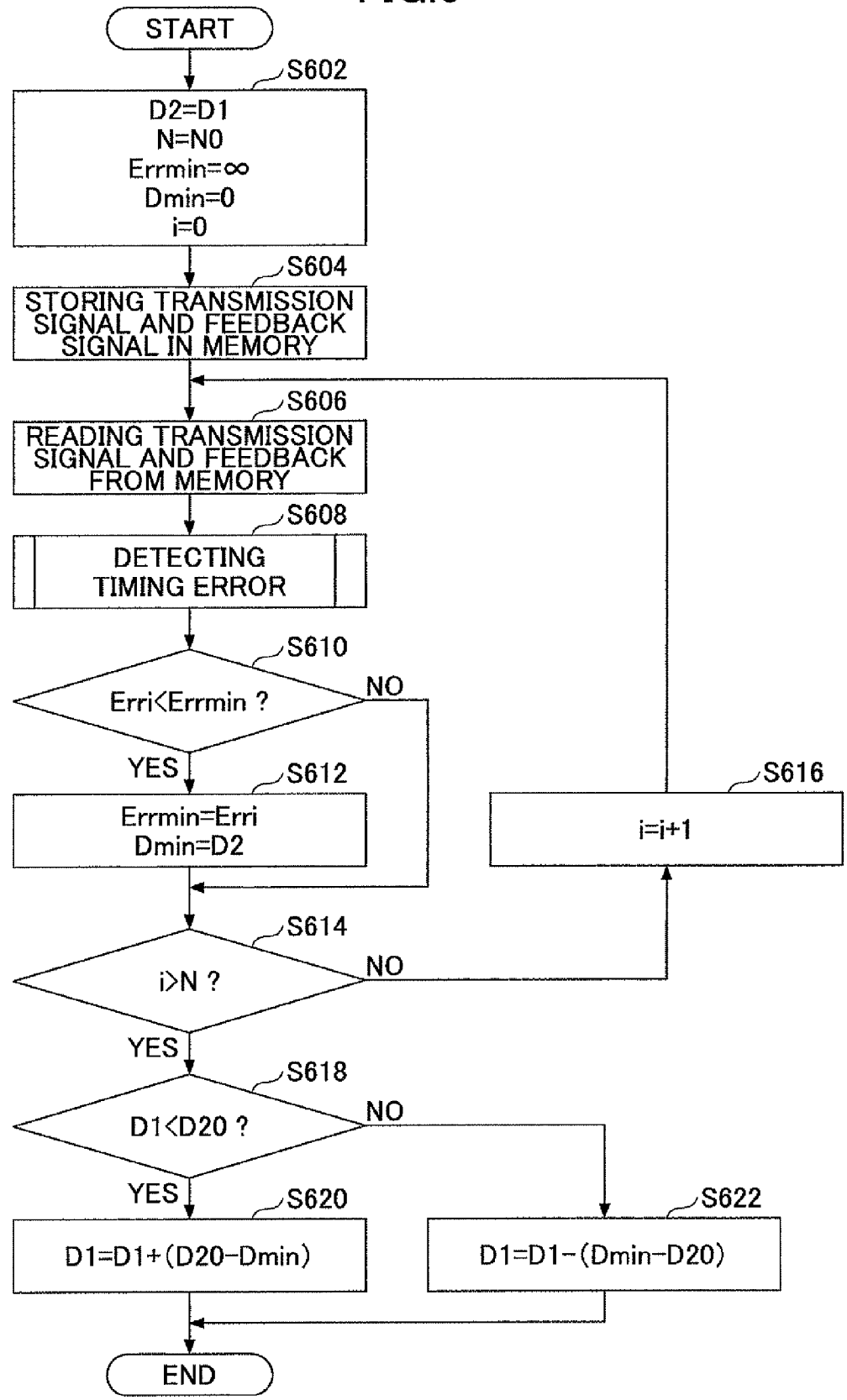
FIG. 6 is an example flowchart of the operation in the transmission device of the embodiment.

FIG. 6 is an example flowchart of the operation in the transmission device 300 of the Embodiment.

Referring to FIG. 6, the reference symbol D1 designates the delay set amount for the timing adjusting circuit 304, and the reference symbol D2 designates a delay set amount for the timing adjusting circuit 3190. Reference symbol N designates the number of times repeating the process, reference symbol Errmin designates a minimum (timing) error, and reference symbol Dmin designates a delay set amount causing the minimum error.

In step S602, the transmission device 300 sets parameters in step. For example, the transmission device 300 sets the same value to be the delay set amount D1 for the timing adjusting circuit 304 and the delay set amount D2 for the timing adjusting circuit 3190. The transmission device 300 may set NO as the number N of times repeating the process. For example, the transmission device 300 sets infinity (a very large number) ($\infty$) as the minimum error Errmin. For example, the transmission device 300 sets zero (0) as the delay set amount Dmin causing the minimum error. For example, the transmission device 300 sets zero (0) as the parameter i indicative of the number N of times repeating the process. For example, the arithmetic processing unit 3186 sets up the delay set amounts D1 and D2, the number N of times repeating the process, the minimum error Errmin, the delay amount Dmin, and the parameter i indicative of the number N of times repeating the process.

In step S604, the transmission device 300 reads the transmission signal and the feedback signal into the memory. For example, the memory 316 stores the transmission signal from the base band processing unit 106 or 206. The memory 320 stores the feedback signal processed as described above from the mixer 324.

In step S606, the transmission device 300 reads the transmission signal stored in the memory 316 and the feedback signal stored in the memory 320 as time-series data. For example, the timing error detecting unit 318 reads the transmission signal stored in the memory 316 and the feedback signal processed as described above and stored in the memory 320 as time-series data.

In step S608, the transmission device 300 detects a timing error Erri. For example, the timing error detecting unit 318 detects the timing error Erri between the minimum value signal and the provisional voltage control signal. As described, the minimum value signal is obtained based on the transmission signal transformed into the voltage control signal and the delayed voltage control signal obtained by delaying the voltage control signal based on the delay amount D2.

In step S610, the transmission device 300 determines whether the timing detected in step S608 is less than the minimum error Errmin. For example, the timing error detecting unit 318 determines whether the timing error Erri is less than the minimum error Errmin.

In step S612, when the timing error Erri is less than the minimum error Errmin in YES of step S610, the transmission device 300 sets the minimum error Errmin to equal the timing error Erri, and sets the delay amount Dmin to equal the delay set amount D2. For example, when the timing error Erri is less than the minimum error Errmin, the timing error detecting unit 318 sets the minimum error Errmin to equal the timing error Erri, and sets the delay amount Dmin to equal the delay set amount D2.

In step S614, when the timing error Erri is not less than the minimum error Errmin in No of step S610, i.e. the timing error Erri is greater than or equal to the minimum error Errmin, the transmission device 300 determines whether the parameter i is greater than the number N of times repeating the process. After the minimum error Errmin is set to equal the timing error Erri in step S612 and the delay amount Dmin is set to equal the delay set amount D2 in step S612, the transmission device 300 determines whether the parameter i is greater than the number N of times repeating the process also in step S614. The number N of times repeating the process may be preset. For example, the timing error detecting unit 318 determines whether the parameter i is greater than the number N of times repeating the process.

In step S618, when the parameter i is greater than the number N of repeating the process in YES of step S614, the transmission device 300 determines whether the delay set amount D1 for the timing adjusting circuit 304 is less than the delay set amount D20 causing the delay amount to be zero in the timing adjusting circuit 3190. For example, the timing error detecting unit 318 determines whether the delay set amount D1 for the timing adjusting circuit 304 is less than the delay set amount D20 causing the delay amount to be zero in the timing adjusting circuit 3190.

In step S616, when the parameter i is less than or equal to the number N of times repeating the process in NO of step S614, the transmission device 300 increments the parameter i to i+1. Thereafter, the process goes back to step S606. The delay set amount D2 is set again, and the timing error is detected.

In step S620, when the delay set amount D1 for the timing adjusting circuit 304 is determined to be less than the delay set amount D20 in YES of step S618, the transmission device 300 acquires a value by subtracting the delay amount Dmin from the delay set amount D20 and then adding the delay set amount D1 to be the subtracted value, and sets the added value to the delay set amount D1. Said differently, the delay set amount D1 to be set in the timing adjusting circuit 304 is acquired with the formula D1+(D20−Dmin). For example, the timing error detecting unit 318 acquires a value by subtracting the delay amount Dmin as the minimum error from the delay set amount D20, and adds the delay set amount D1 to the subtracted value. The added value is set to be the delay set amount D1 to be set in the timing adjusting circuit 304.

In step S622, when the delay set amount D1 for the timing adjusting circuit 304 is determined not to be less than the delay set amount D20 causing the delay amount to be zero in the timing adjusting circuit 3190 in NO of step S618, i.e. the delay set amount D1 for the timing adjusting circuit 304 is greater than or equal to the delay circuit amount D20 causing the delay amount in the timing adjusting circuit 3190 to be zero, the transmission device 300 acquires a value by subtracting the delay set amount D20 from the delay amount Dmin and then subtracting the subtracted value from the delay set amount D1, and sets the subtracted value to be the delay set amount D1. Said differently, the delay set amount D1 to be set in the timing adjusting circuit 304 is acquired with the formula D1−(Dmin−D20). For example, the timing error detecting unit 318 acquires a value by subtracting the delay set amount D20 from the delay amount Dmin as the minimum error, and subtracts the subtracted value from the delay set amount D1. The subtracted value is set as the delay set amount D1 to be set in the timing adjusting circuit 304.

<Process in the Timing Error Detecting Unit 318>

Figure 7:
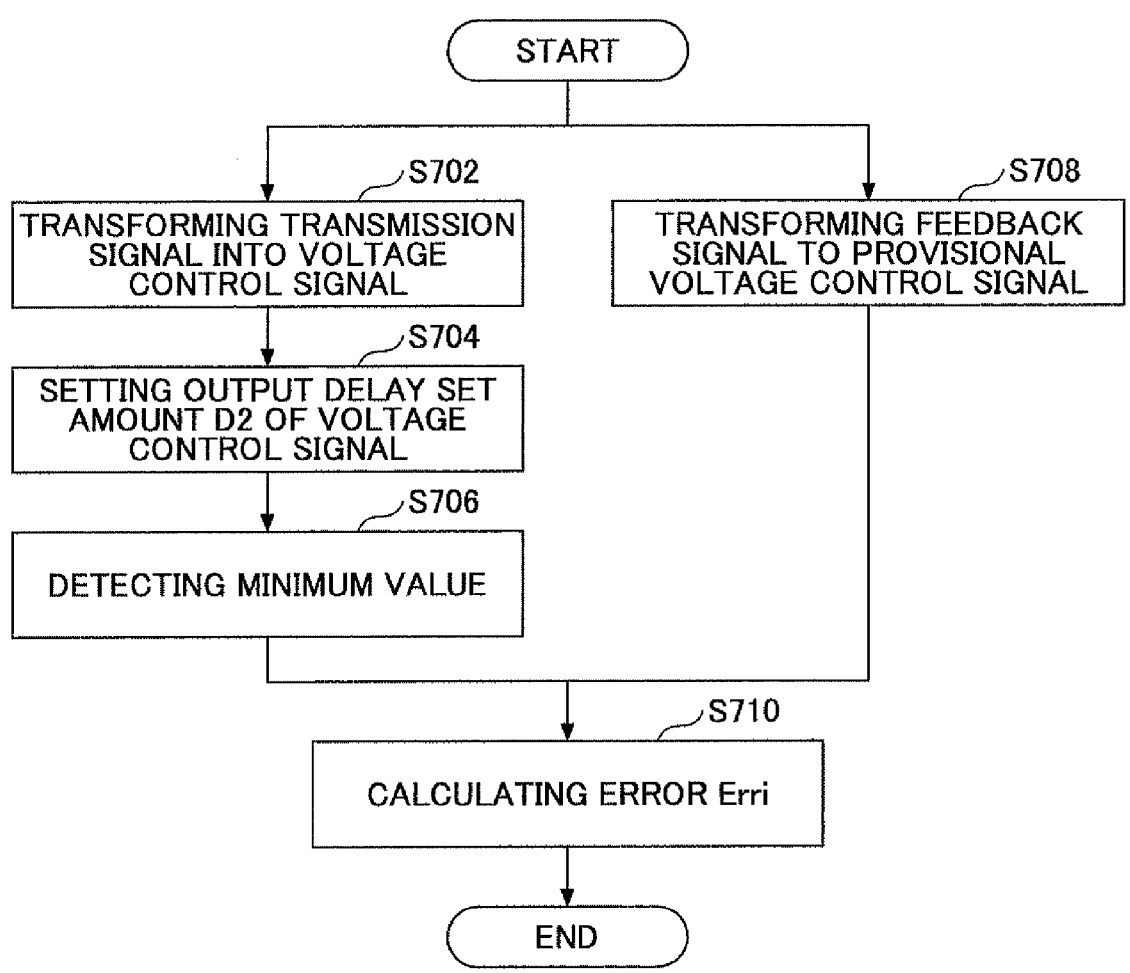
FIG. 7 is an example flowchart of the operation in the transmission device of the embodiment.

FIG. 7 is an example flowchart of the operation of the timing error detecting unit 318 in the transmission device 300 of the Embodiment.

In step S702, the timing error detecting unit 318 transforms the transmission signal into the voltage control signal. For example, the voltage control signal transforming unit 3182 reads the transmission signal stored in the memory 316, and transforms the read transmission signal into the voltage control signal.

In step S704, the timing error detecting unit 318 sets the output delay set amount D2 for the voltage control signal in the timing adjusting circuit 3190. For example, the arithmetic processing unit 3186 sets the output delay set amount D2 in the timing adjusting circuit 3190.

In step S706, the timing error detecting unit 318 detects the minimum value based on the voltage control signal and the delayed voltage control signal obtained by delaying the voltage control signal using the delay set amount D2. For example, the minimum value detecting unit 3184 detects the minimum value based on the voltage control signal and the delayed voltage control signal. The minimum value signal is output from the minimum value detecting unit 3184.

In step S708, the timing error detecting unit 318 transforms the feedback signal which is processed as described above into the provisional voltage control signal. For example, the output signal transforming unit 3188 reads the feedback signal stored in the memory 320 as time series data, and transforms the time series data into the provisional voltage control signal.

In step S710, the timing error detecting unit 318 acquires the timing error Erri based on the minimum value signal and the provisional voltage control signal. For example, the arithmetic processing unit 3186 compares the provisional voltage control signal input from the output signal transforming unit 3188 with the minimum value signal from the minimum value detecting unit 3184. The arithmetic processing unit 3186 acquires the timing error Erri between the provisional voltage control signal and the minimum value signal. For example, the arithmetic processing unit 3186 obtains a time error between the provisional voltage control signal and the minimum value signal. The time error may be a delay amount.

In the Embodiment, the delay set amount may be provided to the transmission signal. When the delay set amount is set in the transmission signal, the timing adjusting circuit may be provided between the base band processing unit 206 and the amplifier 314.

The transmission device of the Embodiment can adjust the delay without outputting spurious waves since the delay set amount is estimated using a portion which does not relate to transmission of the signals.

The transmission data stored in the memory is read as the time series data, the voltage control signal is generated from the time series data, and the delayed voltage control signal is generated by the delay circuit. Further, by detecting the minimum value between the voltage control signal and the delayed voltage control signal, a signal corresponding to the output signal from the amplifier 314, i.e. a signal equivalent to the output signal from the amplifier 314, can be generated. On the other hand, the feedback signal from the amplifier 314 is read as the time series data, and the provisional voltage control signal is generated from the time series data. Then, the delay amount causing the timing error between the minimum value signal equivalent to the output signal from the amplifier 314 and the provisional voltage control signal to be minimum is obtained, and a control timing of the voltage control signal or the transmission signal in the amplifier 314 is corrected by the delay amount. The timing error between the minimum value signal equivalent to the output signal from the amplifier 314 and the provisional voltage control signal may be determined in comparison with a reference value.

<Timing Error Detecting Unit—Second Mode>

Figure 8:
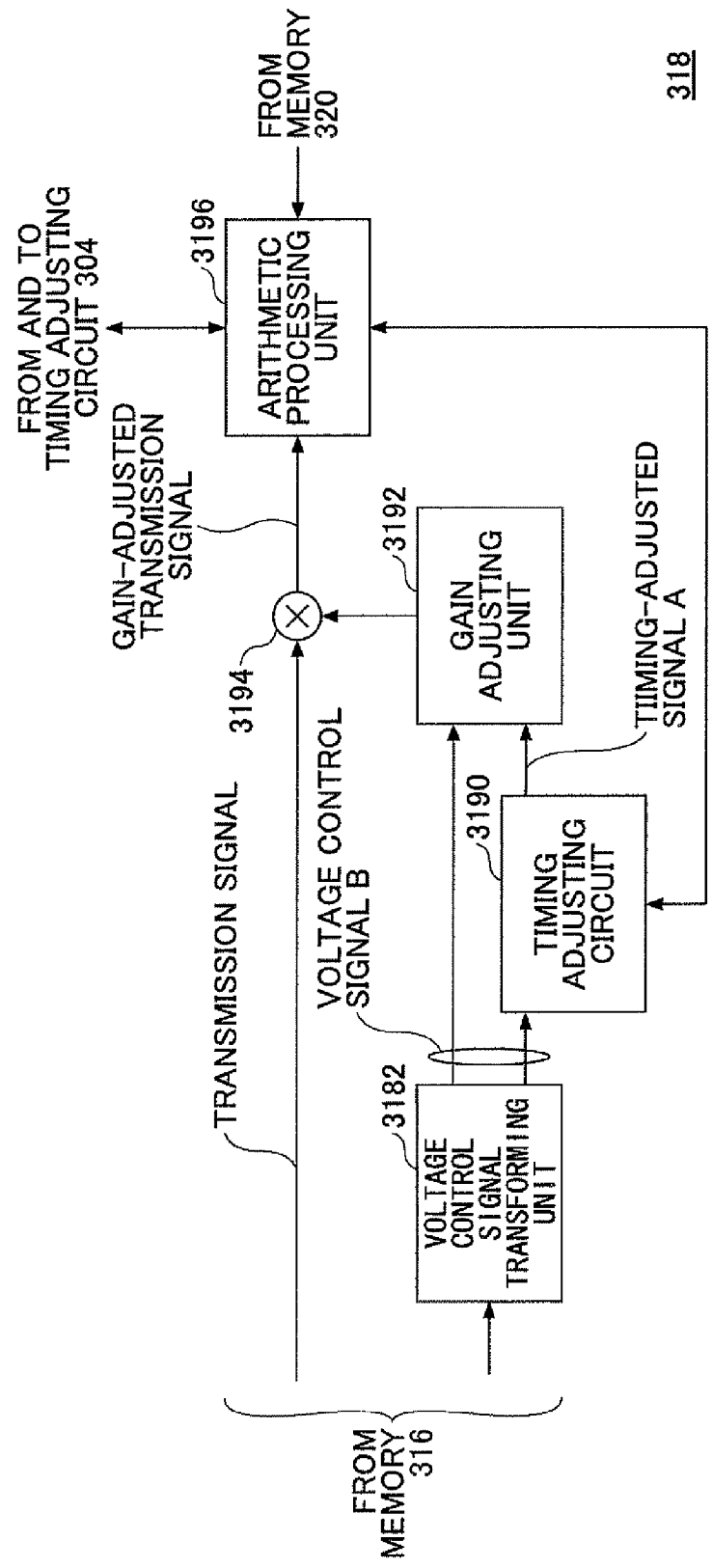
FIG. 8 is an example block diagram illustrating a part of the transmission device of the embodiment.

FIG. 8 is an example block diagram illustrating a second mode of the timing error detecting unit 318 as a part of the transmission device 300 of the Embodiment.

The timing error detecting unit 318 includes a voltage control signal transforming unit 3182, a timing adjusting circuit 3190, a gain adjusting unit 3192, a multiplier 3194, and an arithmetic processing unit 3196.

The voltage control signal transforming unit 3182 is connected to the memory 316. The voltage control signal transforming unit 3182 reads the transmission signal stored in the memory 316 as time series data, transforms the time series data into a voltage control signal B, and outputs the voltage control signal B to the gain adjusting unit 3192 and the timing adjusting circuit 3190.

The timing adjusting circuit 3190 is connected to the voltage control signal transforming unit 3182. The timing adjusting circuit 3190 adjusts the timing of the voltage control signal input from the voltage control signal transforming unit 3182, and outputs the adjusted voltage control signal (hereinafter referred to as timing-adjusted signal A) to the gain adjusting unit 3192. For example, the timing adjusting circuit 3190 adjusts the voltage control signal based on a delay set amount D2 set by the arithmetic processing unit 3196, and outputs the adjusted voltage control signal to the gain adjusting unit 3192. The timing may be a timing of inputting to the gain adjusting unit 3192.

As described, the gain adjusting unit 3192 is connected to the voltage control signal transforming unit 3182, and the timing adjusting circuit 3190. The gain adjusting unit 3192 determines a gain adjusting value based on the voltage control signal B input from the voltage control signal transforming unit 3182 and the timing-adjusted signal A which is obtained by adjusting the timing of the voltage control signal with the timing adjusting circuit 3190. For example, when the voltage control signal B has an advanced phase in comparison with that of the timing-adjusted signal A, and the amplitude of the voltage control signal B is greater than that of the timing-adjusted signal A (the amplitude of the voltage control signal A is less than the amplitude of the voltage control signal B), the amplitude of the timing-adjusted signal A is divided by the amplitude of the voltage control signal B in order to acquire the gain adjusting value. For example, when the voltage control signal B has an advanced phase in comparison with that of the timing-adjusted signal A, and the amplitude of the voltage control signal B is not greater than that of the timing-adjusted signal A (the amplitude of the voltage control signal B is less than or equal to the amplitude of the timing-adjusted signal A), the gain adjusting unit 3192 sets the gain adjusting value as 1.

For example, when the voltage control signal B has a delayed phase in comparison with that of the timing-adjusted signal A, and the amplitude of the voltage control signal B is greater than or equal to the amplitude of the timing-adjusted signal A, the gain adjusting unit 3192 sets the gain adjusting value as 1. For example, when the voltage control signal B has a delayed phase in comparison with that of the timing-adjusted signal A, and the amplitude of the timing-adjusted signal A is greater than that of the voltage control signal B (the amplitude of the voltage control signal B is less than the amplitude of the voltage control signal A), the amplitude of the voltage control signal B is divided by the amplitude of the timing-adjusted signal A in order to acquire the gain adjusting value. The gain adjusting unit 3192 outputs the gain adjusting value to the multiplier 3194.

The multiplier 3194 is connected to the memory 316 and the gain adjusting unit 3192. The multiplier 3194 multiplies the transmission signal read as the time series data from the memory 316 by the gain adjusting value input from the gain adjusting unit 3192, and outputs the multiplied signal to the arithmetic processing unit 3196. Hereinafter, the signal output from the multiplier 3194 is referred to as "gain-adjusted transmission signal".

Figure 9:
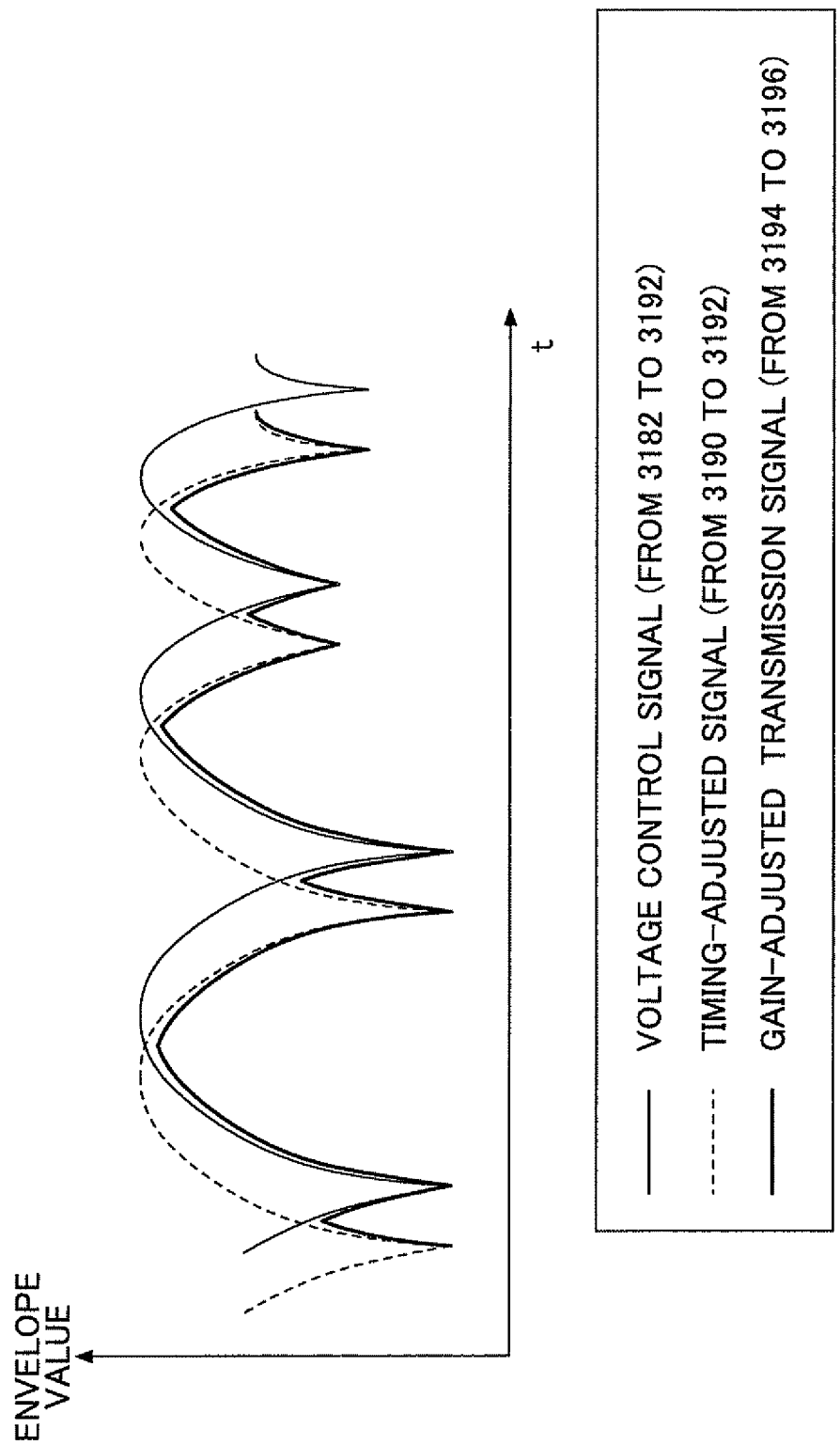
FIG. 9 is a graph schematically illustrating the operation of the transmission device of the embodiment.

FIG. 9 is a graph schematically illustrating the signal output from the multiplier 3194 in the transmission device 300 of the Embodiment.

Referring to FIG. 9, the abscissa represents time (t) and the ordinate represents envelope value. Narrow solid lines designate the voltage control signal B input from the voltage control signal transforming unit 3182. Broken lines designate the timing-adjusted signal A in which the timing of the voltage control signal is adjusted using the delay set amount D2 and which is input from the timing adjusting circuit 3190. Heavy solid lines designate an output signal (gain-adjusted transmission signal) from the multiplier 3194. Referring to FIG. 9, an example that the voltage control signal B has an advanced phase in comparison with that of the timing-adjusted signal A is illustrated.

The arithmetic processing unit 3196 is connected to the multiplier 3194, the timing adjusting circuit 304, and the timing adjusting circuit 3190. The arithmetic processing unit 3196 compares time series data of the feedback signal which have been processed as described above and stored in the memory 320 with the gain-adjusted transmission signal input from the multiplier 3194. The arithmetic processing unit 3196 obtains a timing error between the time series data of the feedback signal and the gain-adjusted transmission signal. For example, the arithmetic processing unit 3196 acquires a time error between the gain-adjusted transmission signal and the time-series data which have been processed as described above. The time error may be a delay amount. The arithmetic processing unit 3196 temporarily stores the timing error, and changes the delay set amount D2 to be set to the timing adjusting circuit 3190. By use of the delay set amount D2 which has been changed, the arithmetic processing unit 3196 compares the time series data of the feedback signal processed as described above and stored in the memory 320 with the gain-adjusted transmission signal input from the multiplier 3194. The arithmetic processing unit 3196 acquires a timing error between the time series data and the gain-adjusted transmission signal. For example, the arithmetic processing unit 3196 acquires a relationship between the gain-adjusted transmission signal and the time-series data processed as described above. The arithmetic processing unit 3196 temporarily stores the timing error. The change of the delay set amount D2 may be carried out until the timing error is minimized, or the number of times changing the delay set amounts D2 may be preset. When a correlation is obtained, it may be carried out until the correlation is maximized, or the number of changing the delay set amount D2 may be preset. For example, the timing error at a time of changing from decrementing to incrementing may be set as the minimum value up to which the delay set amount D2 is changed. On the other hand, the correlation of a time of changing from incrementing to decrementing may be set as the maximum value up to which the delay set amount D2 is changed. The arithmetic processing unit 3196 acquires the delay set amount Dmin of a time when the timing error is minimized from the timing adjusting circuit 3190. The arithmetic processing unit 3196 may acquire the delay set amount of a time when the correlation is maximized from the timing adjusting circuit 3190. The arithmetic processing unit 3196 acquires the delay set amount D1 for the timing adjusting circuit 304 based on the acquired delay set amount Dmin. The arithmetic processing unit 3186 sets the delay set amount D1 in the timing adjusting circuit 304.

<Operation of the Transmission Device 300>

The operation of the transmission device 300 is similar to that illustrated in FIG. 6.

<Process in the Timing Error Detecting Unit 318>

Figure 10:
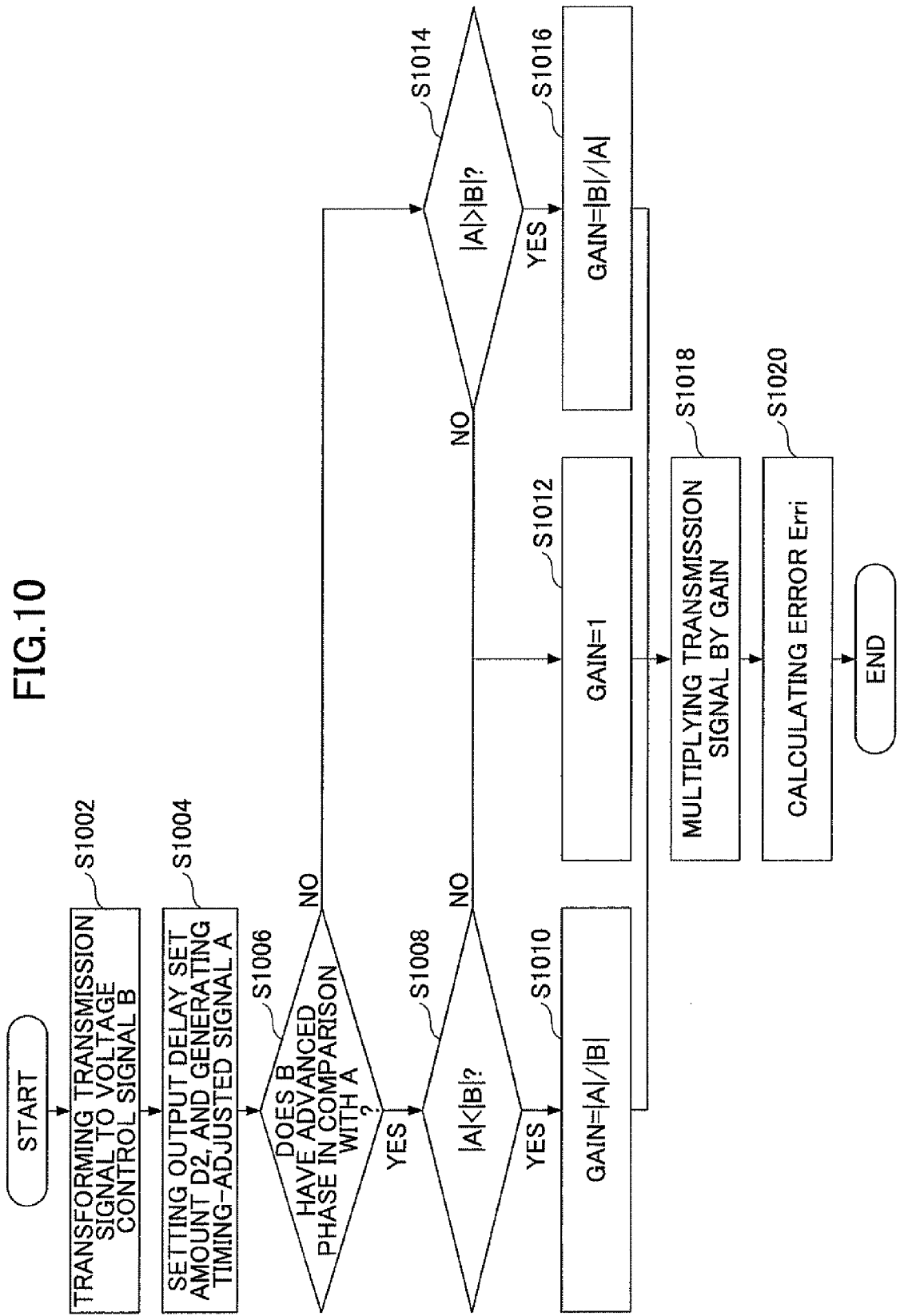
FIG. 10 is an example flowchart of the operation in the transmission device of the embodiment.

FIG. 10 is an example flowchart of the operation of the timing error detecting unit 318 in the transmission device 300 of the Embodiment.

In step S1002, the timing error detecting unit 318 transforms the transmission signal into the voltage control signal B. For example, the voltage control signal transforming unit 3182 reads the transmission signal stored in the memory 316, and transforms the read transmission signal into the voltage control signal B.

In step S1004, the timing error detecting unit 318 sets an output delay set amount D2 for the voltage control signal to the timing adjusting circuit 3190. For example, the arithmetic processing unit 3186 sets the output delay set amount D2 to the timing adjusting circuit 3190.

In step S1006, the timing error detecting unit 318 determines whether the voltage control signal B has an advanced phase in comparison with that of the timing-adjusted signal A in which the timing of the voltage control signal B is adjusted using the delay set amount D2 set to the timing adjusting circuit 3190. For example, the gain adjusting unit 3192 determines whether the voltage control signal B has an advanced phase in comparison with that of the timing-adjusted signal A.

In step S1008, when it is determined that the voltage control signal B has an advanced phase in comparison with that of the timing-adjusted signal A in YES of step S1006, the timing error detecting unit 318 determines whether the amplitude |A| of the timing-adjusted signal A is less than the amplitude |B|. For example, the gain adjusting unit 3192 determines whether the amplitude |A| of the timing-adjusted signal A is less than the amplitude |B| of the voltage control signal B.

In step S1010, when the amplitude |A| of the timing-adjusted signal A is less than the amplitude |B| in YES of step S1008, the amplitude |A| of the timing-adjusted signal A is divided by the amplitude |B| of the voltage control signal B in the timing error detecting unit 318 in order to obtain a gain adjusting value. For example, the gain adjusting unit 3192 acquires the gain adjusting value by dividing the amplitude |A| of the timing-adjusted signal A by the amplitude |B| of the voltage control signal B.

In step S1012, when the amplitude |A| of the timing-adjusted signal A is not less than the amplitude |B| of the voltage control signal B in NO of step S1008, the timing error detecting unit 318 sets the gain adjusting value as 1. For example, the gain adjusting unit 3192 sets the gain adjusting value as 1.

In step S1014, when it is determined that the voltage control signal B does not have an advanced phase in comparison with that of the timing-adjusted signal A in NO of step S1006, the timing error detecting unit 318 determines whether the amplitude |B| of the voltage control signal B is less than the amplitude |A| of the timing-adjusted signal A. For example, the gain adjusting unit 3192 determines whether the amplitude |B| of the voltage control signal B is less than the amplitude |A| of the timing-adjusted signal A.

In step S1016, when the amplitude |B| of the voltage control signal B is less than the amplitude |A| of the timing-adjusted signal A in YES of step S1014, the amplitude |B| of the voltage control signal B is divided by the amplitude |A| of the timing-adjusted signal A in the timing error detecting unit 318 in order to obtain the gain adjusting value. For example, the gain adjusting unit 3192 acquires the gain adjusting value by dividing the amplitude |B| of the voltage control signal B by the amplitude |A| of the timing-adjusted signal A.

In step S1012, when the amplitude |B| of the voltage control signal B is not less than the amplitude |A| of the timing-adjusted signal A in NO of step S1014, the timing error detecting unit 318 sets the gain adjusting value as 1. For example, the gain adjusting unit 3192 sets the gain adjusting value as 1.

In step S1018, the timing error detecting unit 318 multiplies the transmission signal by the gain adjusting value acquired in steps S1010, S1012 and S1016. For example, the multiplier 3194 multiplies the transmission signal by the gain adjusting value input from the gain adjusting unit 3192.

In step S1020, the timing error detecting unit 318 acquires a timing error Erri based on the time series data processed as described above and the gain adjusted transmission signal. For example, the arithmetic processing unit 3196 compares the gain-adjusted transmission signal input from the multiplier 3194 with the time series data obtained by reading the feedback signal which have been provided with predetermined process and stored in the memory 320. For example, the arithmetic processing unit 3186 acquires the timing error Erri between the gain-adjusted transmission signal and the time-series data which have been processed as described above. The time error may be a delay amount.

With the transmission device 300, it is possible to produce a signal corresponding to the feedback signal. Accordingly, without transforming the transmission signal to the voltage signal, the timing error is obtainable.

<Timing Error Detecting Unit—Third Mode>

Figure 11:
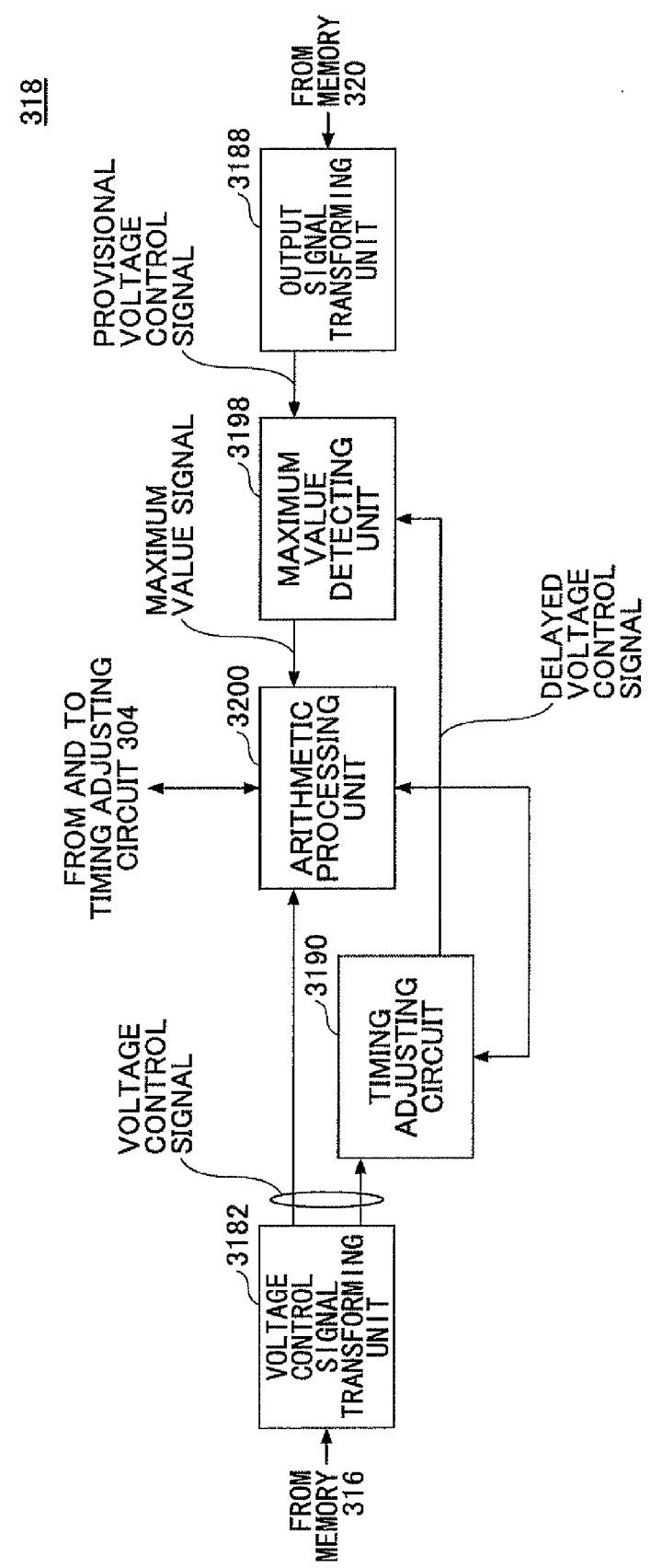
FIG. 11 is an example block diagram illustrating a part of the transmission device of the embodiment.

FIG. 11 is an example block diagram illustrating a third mode of the timing error detecting unit 318 as a part of the transmission device 300 of the Embodiment.

The timing error detecting unit 318 includes a voltage control signal transforming unit 3182, an arithmetic processing unit 3200, an output signal transforming unit 3188, a timing adjusting circuit 3190 and a maximum value detecting unit 3198.

The voltage control signal transforming unit 3182 is connected to the memory 316. The voltage control signal transforming unit 3182 reads the transmission signal stored in the memory 316 as time series data, transforms the time series data into the voltage control signal, and outputs the transformed voltage control signal to the arithmetic processing unit 3200 and the timing adjusting circuit 3190.

Figure 12:
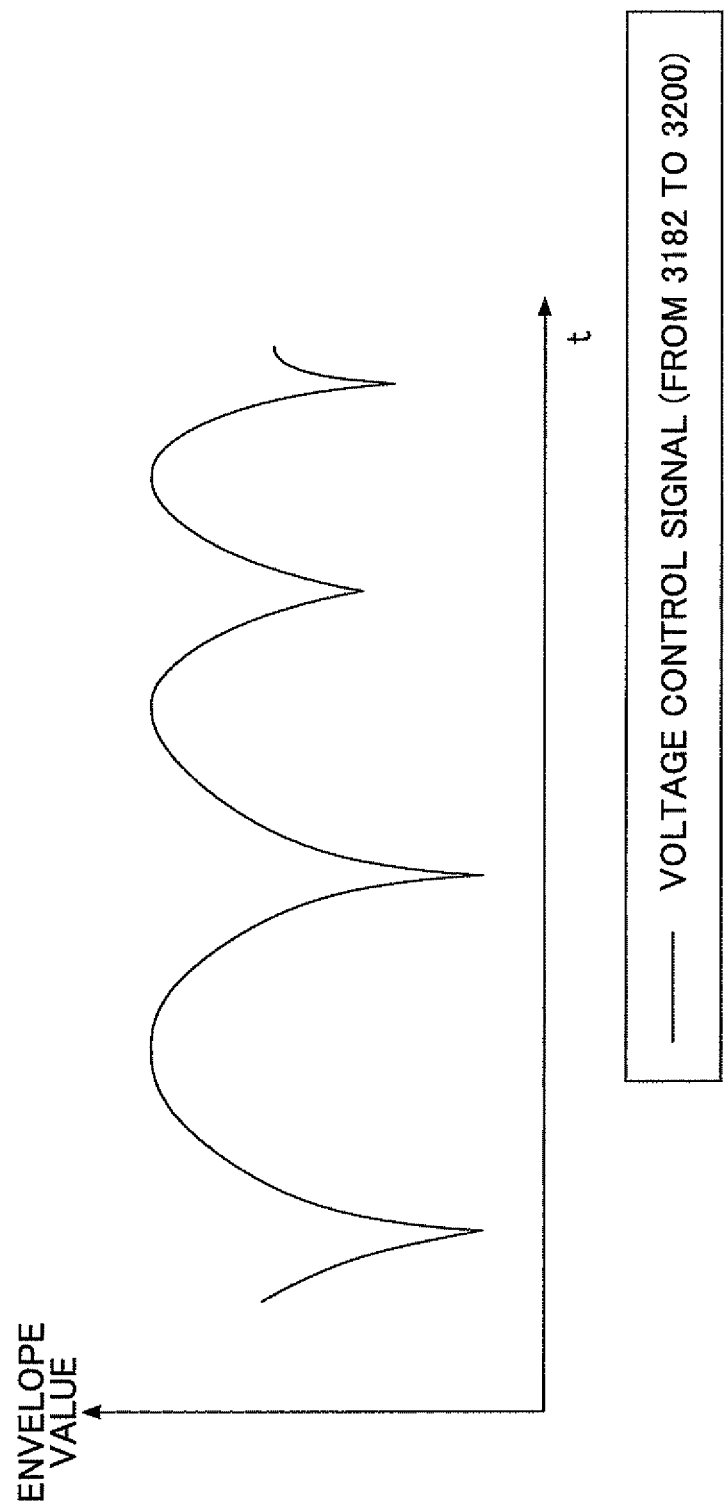
FIG. 12 is a graph schematically illustrating the operation of the transmission device of the embodiment.

FIG. 12 is a graph schematically illustrating an example of the voltage control signal in the transmission device 300 of the Embodiment. Referring to FIG. 12, the abscissa represents time (t) and the ordinate represents envelope value.

The timing adjusting circuit 3190 is connected to the voltage control signal transforming unit 3182. The timing adjusting circuit 3190 adjusts the timing of the voltage control signal input from the voltage control signal transforming unit 3182, and outputs the adjusted voltage control signal to the maximum value detecting unit 3198. For example, the voltage control signal is delayed by the timing adjusting circuit 3190 based on a delay set amount D2 which is set by the arithmetic processing unit 3200, and the timing adjusting circuit 3190 outputs the delayed voltage control signal to the maximum value detecting unit 3198. Hereinafter, the signal to be input to the maximum value detecting unit 3198 is referred to as "delayed voltage control signal".

The output signal transforming unit 3188 is connected to the memory 320. The output signal transforming unit 3188 reads the feedback signal processed as described above and stored in the memory 320 as time series data, transforms the time series data into a provisional voltage control signal, and outputs the provisional voltage control signal to the maximum value detecting unit 3198. Hereinafter, the voltage control signal provisionally transformed by the output signal transforming unit 3188 is referred to as "provisional voltage control signal". In this, "provisional voltage control signal" is processed by the voltage control signal transforming circuit 302 and the voltage control signal transforming unit 3182 using the feedback signal, and the mixer 324 to be down-converted in a similar manner to the above, but is not actually used as the voltage control signal.

As described, the minimum value detecting unit 3198 is connected to the output signal transforming unit 3188 and the timing adjusting circuit 3190. The maximum value detecting unit 3198 acquires the maximum value between the provisional voltage control signal input from the output signal transforming unit 3188 and the delayed voltage control signal input from the timing adjusting circuit 3190, and outputs the maximum value to the arithmetic processing unit 3200 as a signal equivalent to the voltage control signal output by the output signal transforming unit 3200. Hereinafter, the signal indicative of the maximum value is referred to as "maximum value signal".

Figure 13:
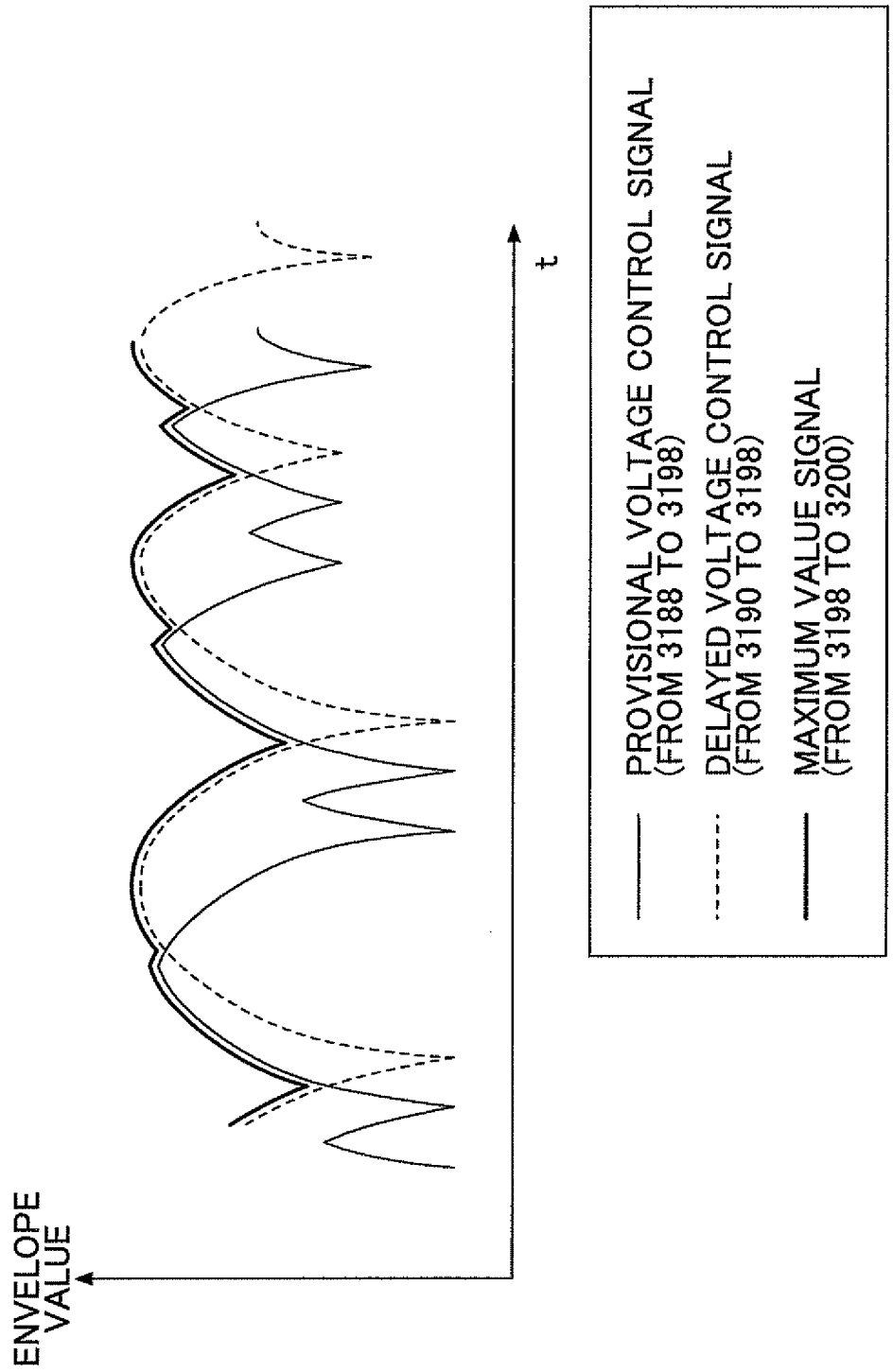
FIG. 13 is a graph schematically illustrating the operation of the transmission device of the embodiment.

FIG. 13 is a graph schematically illustrating the output maximum value detecting unit 3198 as an operation of the transmission device 300 of the Embodiment.

Referring to FIG. 13, the abscissa represents time (t) and the ordinate represents envelope value. Narrow solid lines designate the provisional voltage control signal input from the output signal transforming unit 3188. Broken lines designate the delayed voltage control signal which has been delayed based on the delay set amount D2 of the voltage control signal which is input by the timing adjusting circuit 3190. Heavy solid lines designate an output signal (maximum value signal) from the maximum value detecting unit 3198. The maximum value signal follows the greater values between the values of the provisional voltage control signal and the values of the delayed voltage control signal.

The arithmetic processing unit 3200 is connected to the timing adjusting circuit 304, the voltage control signal transforming unit 3182, the timing adjusting circuit 3190, and the maximum value detecting unit 3198. The arithmetic processing unit 3200 compares the voltage control signal input from the voltage control signal transforming unit 3182 with the maximum value signal from the maximum value detecting unit 3198. The arithmetic processing unit 3200 acquires a timing error between the voltage control signal and the maximum value signal. The time error may be a delay amount. For example, the arithmetic processing unit 3200 acquires a time error between the provisional voltage control signal and the maximum value signal. For example, the arithmetic processing unit 3200 may acquire a relationship between the voltage control signal and the maximum value signal. The arithmetic processing unit 3200 temporarily stores the timing error, and changes the delay set amount D2 to be set in the timing adjusting circuit 3190. The arithmetic processing unit 3200 compares the voltage control signal input from the voltage control signal transforming unit 3182 with the maximum value signal from the maximum value detecting unit 3198. The arithmetic processing unit 3200 acquires the timing error between the voltage control signal and the maximum value signal. For example, the arithmetic processing unit 3200 acquires a time error between the voltage control signal and the maximum value signal. The time error may be a delay amount. For example, the arithmetic processing unit 3200 may acquire a relationship between the voltage control signal and the maximum value signal. The arithmetic processing unit 3200 temporarily stores the timing error. The change of the delay set amount D2 may be carried out until the timing error is minimized, or the number of times changing the delay set amounts D2 may be preset. When a correlation is obtained, obtaining the correlation may be carried out until the correlation is maximized, or the number of times changing the delay set amount D2 may be preset. For example, the timing error at a time of changing from decrementing to incrementing may be set as the minimum value. On the other hand, the correlation of a time of changing from incrementing to decrementing may be set as the maximum value up to which the delay set amount D2 is changed. The arithmetic processing unit 3200 acquires the delay set amount Dmin of a time when the timing error is minimized from the timing adjusting circuit 3190. The arithmetic processing unit 3200 acquires the delay set amount D1 for the timing adjusting circuit 304 based on the acquired delay set amount Dmin. The arithmetic processing unit 3200 sets the delay set amount D1 to the timing adjusting circuit 304.

<Operation of the Transmission Device 300>

The operation of the transmission device 300 is similar to that illustrated in FIG. 6.

<Process in the Timing Error Detecting Unit 318>

Figure 14:
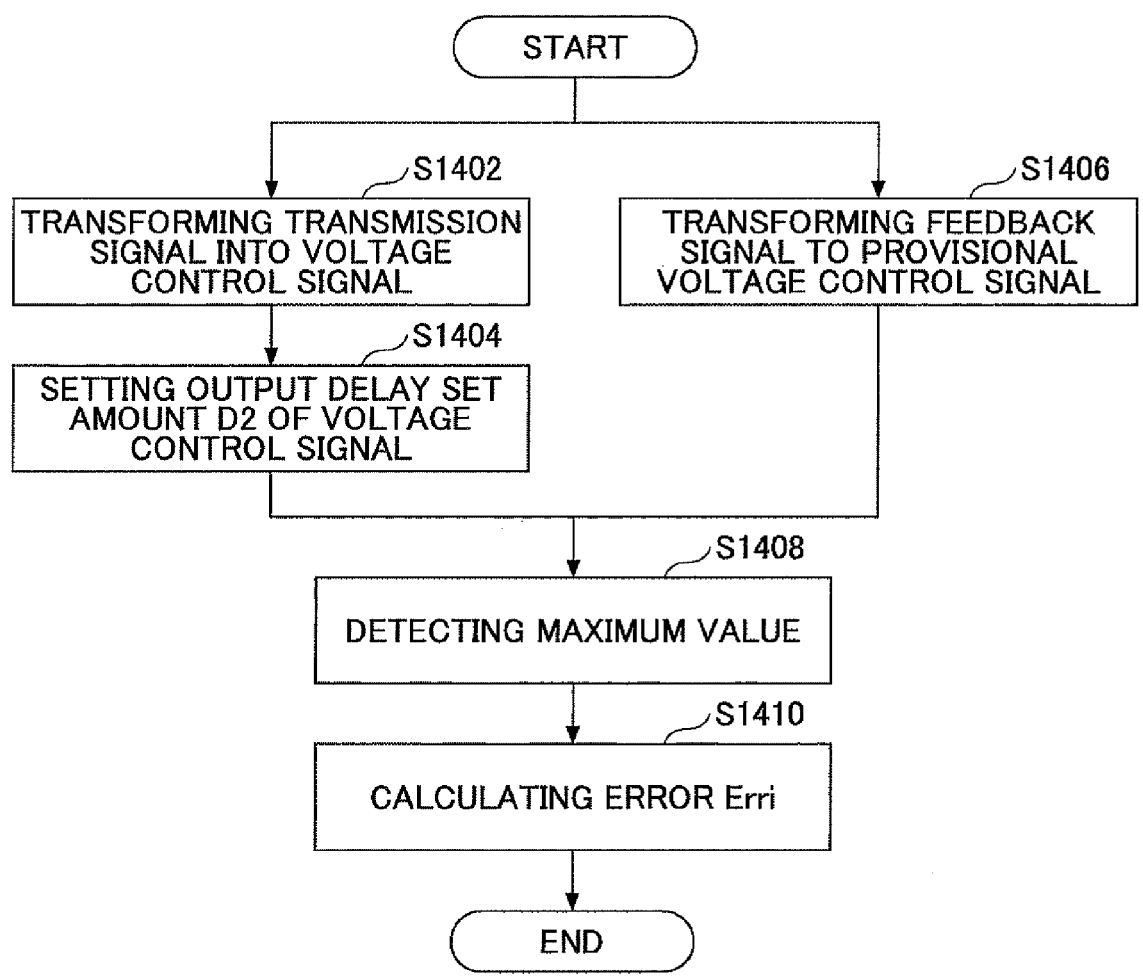
FIG. 14 is an example flowchart of the operation in the transmission device of the embodiment.

FIG. 14 is an example flowchart of the operation of the timing error detecting unit 318 in the transmission device 300 of the Embodiment.

In step S1402, the timing error detecting unit 318 transforms the transmission signal into the voltage control signal. For example, the voltage control signal transforming unit 3182 reads the transmission signal stored in the memory 316, and transforms the read transmission signal into the voltage control signal.

In step S1404, the timing error detecting unit 318 sets the output delay set amount D2 for the voltage control signal in the timing adjusting circuit 3190. For example, the arithmetic processing unit 3200 sets the output delay set amount D2 in the timing adjusting circuit 3190.

In step S1406, the timing error detecting unit 318 transforms the feedback signal processed as described above into the provisional voltage control signal. For example, the output signal transforming unit 3188 reads the feedback signal processed as described above and stored in the memory 320 as time series data, and transforms the time series data into the provisional voltage control signal.

In step S1408, the timing error detecting unit 318 detects the maximum value based on the provisional voltage control signal and the delayed voltage control signal acquired by delaying the voltage control signal for the delay set amount D2 which is set by the timing adjusting circuit 3190. For example, the maximum value detecting unit 3198 detects the maximum value based on the provisional voltage control signal and the delayed voltage control signal. The maximum value signal is output from the maximum value detecting unit 3198.

In step S1410, the timing error detecting unit 318 acquires a timing error Err based on the maximum value signal and the voltage control signal produced by transforming the transmission signal. For example, the arithmetic processing unit 3200 compares the voltage control signal input from the voltage control signal transforming unit 3182 with the maximum value signal from the maximum value detecting unit 3198. The arithmetic processing unit 3200 acquires the timing error Erri between the voltage control signal and the maximum value signal. For example, the arithmetic processing unit 3200 acquires a time error between the voltage control signal and the maximum value signal. The time error may be a delay amount.

With the transmission device 300 of the Embodiment, a signal corresponding to the voltage control signal which is obtained by transforming the transmission signal may be produced from the output signal from the amplifier.

According to a transmission device and the transmission method of the Embodiment, it is possible to adjust the control timing in the amplifier while reducing influence on the transmission signal wave.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission device comprising:
    a voltage control signal generating unit configured to generate a first voltage control signal from a transmission signal;
    an amplifier configured to amplify the transmission signal in response to the first voltage control signal;
    a first timing adjusting unit configured to adjust a control timing for the first voltage control signal; and
    a control timing setting unit configured to set the control timing adjusted by the first timing adjusting unit based on the output signal from the amplifier and the transmission signal,
    wherein the control timing setting unit includes
        a second voltage control signal generating unit configured to generate a second voltage control signal from the transmission signal,
        an output signal transforming unit configured to generate a provisional voltage control signal from the output signal from the amplifier,
        a timing control unit configured to control a timing of the second voltage control signal,
        a signal generating unit configured to generate a signal which corresponds to the provisional voltage control signal generated by the output signal transforming unit based on the second voltage control signal and the second voltage control signal of which timing is controlled by the timing controlling unit,
        a comparing unit configured to compare the signal generated by the signal generating unit with the provisional voltage control signal, and
        a control timing determining unit configured to determine the timing of the second voltage control signal and determine the control timing to be set in the first timing adjusting unit.

2. The transmission device according to claim 1, wherein the signal generating unit outputs a minimum value signal based on the second voltage control signal and the second voltage control signal of which timing is controlled by the timing controlling unit.

3. The transmission device according to claim 1, wherein the comparing unit compares the signal generated by the signal generating unit with the provisional voltage control signal by acquiring at least one of a timing error and a correlation between the signal generated by the signal generating unit and a third voltage control signal.

4. A transmission device comprising:
    a voltage control signal generating unit configured to generate a first voltage control signal from a transmission signal;

an amplifier configured to amplify the transmission signal in response to the first voltage control signal;

a first timing adjusting unit configured to adjust a control timing for the first voltage control signal; and a control timing setting unit configured to set the control timing adjusted by the first timing adjusting unit based on the output signal from the amplifier and the transmission signal, wherein the control timing setting unit includes a second voltage control signal generating unit configured to generate a second voltage control signal from the transmission signal, a timing control unit configured to control a timing of the second voltage control signal, a gain adjusting value generating unit configured to generate the gain adjustment value based on the second voltage control signal and the second voltage control signal that timing is controlled by the second voltage control unit, a multiplier configured to multiply a gain adjusting value by the transmission signal, a comparing unit configured to compare the transmission signal multiplied by the gain adjusting value with the output signal from the amplifier, and a control timing determining unit configured to determine the timing of the second voltage control signal based on a comparison result by the comparing unit, and determine the control timing to be set in the first timing adjusting unit based on the determined timing.

5. The transmission device according to claim 4, wherein, in the gain adjusting value generating unit, when the second voltage control signal has an advanced phase in comparison with that of a timing-adjusted second voltage control signal of which timing is controlled, and an amplitude of the timing-adjusted second voltage control signal is less than an amplitude of the second voltage control signal, the gain adjusting value is set as a value obtained by dividing the amplitude of the timing-adjusted second voltage control signal by the amplitude of the second voltage control signal; and when the second voltage control signal has an advanced phase in comparison with that of the timing-adjusted second voltage control signal of which timing is controlled, and the amplitude of the timing-adjusted second voltage control signal is not less than the amplitude of the second voltage control signal, the gain adjusting value is set as 1.

6. The transmission device according to claim 4, wherein, in the gain adjusting value generating unit, when the second voltage control signal has a delayed phase in comparison with that of a timing-adjusted second voltage control signal of which timing is controlled, and an amplitude of the second voltage control signal is less than an amplitude of the timing-adjusted second voltage control signal, the gain adjusting value is set as a value obtained by dividing the amplitude of the second voltage control signal by the amplitude of the timing-adjusted second voltage control signal; and when the second voltage control signal has a delayed phase in comparison with that of the timing-adjusted second voltage control signal of which timing is controlled, and the amplitude of the second voltage control signal is not less than the amplitude of the timing-adjusted second voltage control signal, the gain adjusting value is set as 1.

7. The transmission device according to claim 4, wherein the comparing unit compares the transmission signal multiplied by the gain adjusting value with the output signal from the amplifier by acquiring at least one of a timing error and a correlation between the transmission signal multiplied by the gain adjusting value and the output signal from the amplifier.

8. A transmission device comprising:

a voltage control signal generating unit configured to generate a first voltage control signal from a transmission signal;

an amplifier configured to amplify the transmission signal in response to the first voltage control signal;

a first timing adjusting unit configured to adjust a control timing for the first voltage control signal; and a control timing setting unit configured to set the control timing adjusted by the first timing adjusting unit based on the output signal from the amplifier and the transmission signal, wherein the control timing setting unit includes a second voltage control signal generating unit configured to generate a second voltage control signal from the transmission signal, an output signal transforming unit configured to generate a provisional voltage control signal from the output signal from the amplifier, a timing control unit configured to control a timing of the second voltage control signal, a signal generating unit configured to generate a signal corresponding to the second voltage control signal based on the provisional voltage control signal generated by the output signal transforming unit and a timing-controlled second voltage control signal of which timing is controlled by the timing controlling unit, a comparing unit configured to compare the signal generated by the signal generating unit with the second voltage control signal, and a control timing determining unit configured to determine the timing of the second voltage control signal based on a comparison result by the comparing unit, and determine the control timing to be set in the first timing adjusting unit based on the determined timing.

9. The transmission device according to claim 8, wherein the signal generating unit outputs a maximum value between the provisional voltage control signal and the second voltage control signal of which timing is controlled by the timing controlling unit based on the provisional voltage control signal and the second voltage control signal.

10. The transmission device according to claim 8, wherein the comparing unit compares the signal generated by the signal generating unit with the second voltage control signal by acquiring at least one of a timing error and a correlation between the signal generated by the signal generating unit and the second voltage control signal.

11. A transmission method comprising:

generating a first voltage control signal from a transmission signal;

amplifying, with an amplifier, the transmission signal in response to the first voltage control signal;

adjusting a control timing for the first voltage control signal to the amplifier; and setting the control timing adjusted by the adjusting the control timing based on the output signal from the amplifier and the transmission signal, wherein the setting the control timing includes generating a second voltage control signal from the transmission signal, generating a provisional voltage control signal from the output signal from the amplifier, controlling a timing of the second voltage control signal, generating a signal which corresponds to the provisional voltage control signal generated by the generating the provisional voltage control signal based on the second voltage control signal and the second voltage control signal of which timing is controlled, comparing the signal generated corresponding to the provisional voltage control signal with the provisional voltage control signal, determining the timing of the second voltage control signal, and determining the control timing to be set in adjusting the control timing for the first voltage control signal to the amplifier based on the timing of the second voltage control signal.

12. A transmission method comprising:

generating a first voltage control signal from a transmission signal;

amplifying, with an amplifier, the transmission signal in response to the first voltage control signal;

adjusting a control timing for the first voltage control signal to the amplifier; and setting the control timing adjusted by the adjusting the control timing based on the output signal from the amplifier and the transmission signal, wherein the setting the control timing includes generating a second voltage control signal from the transmission signal, controlling a timing of the second voltage control signal, generating a gain adjusting value for adjusting a level of the transmission signal based on the second voltage control signal and the second voltage control signal of which timing is controlled by the controlling the timing of the second voltage control signal, multiplying the gain adjusting value by the transmission signal, comparing the transmission signal multiplied by the gain adjusting value with the output signal from the amplifier, determining the timing of the second voltage control signal based on a comparison result obtained by the comparing the transmission signal multiplied by the gain adjusting value with the output signal from the amplifier, and determining the control timing to be set in the adjusting the control timing for the first voltage control signal from a transmission signal based on the timing of the second voltage control signal.

13. A transmission method comprising:

generating a first voltage control signal from a transmission signal;

amplifying, with an amplifier, the transmission signal in response to the first voltage control signal;

adjusting a control timing for the first voltage control signal to the amplifier; and setting the control timing adjusted by the adjusting the control timing based on the output signal from the amplifier and the transmission signal, wherein the setting the control timing includes generating a second voltage control signal from the transmission signal, generating a provisional voltage control signal from the output signal from the amplifier, controlling a timing of the second voltage control signal, generating a signal corresponding to the second voltage control signal based on the provisional voltage control signal and the second voltage control signal of which timing is controlled, comparing the signal generated corresponding to the second voltage control signal with the second voltage control signal, and determining the timing of the second voltage control signal based on a comparison result in the comparing the signal generated corresponding to the second voltage control signal with the second voltage control signal, and determining the control timing to be set in the adjusting the control timing for the first voltage control signal from a transmission signal based on the determined timing.

* * * * *